US006766385B2

(12) United States Patent
Dodd et al.

(10) Patent No.: US 6,766,385 B2
(45) Date of Patent: Jul. 20, 2004

(54) DEVICE AND METHOD FOR MAXIMIZING PERFORMANCE ON A MEMORY INTERFACE WITH A VARIABLE NUMBER OF CHANNELS

(75) Inventors: James M. Dodd, Shingle Springs, CA (US); Brian P. Johnson, Folsom, CA (US); Jay C. Wells, Folsom, CA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 10/041,679

(22) Filed: Jan. 7, 2002

(65) Prior Publication Data

US 2003/0131161 A1 Jul. 10, 2003

(51) Int. Cl.[7] .................. G06F 13/28; G06F 13/00; G06F 13/14; G06F 3/00; G06F 12/00
(52) U.S. Cl. .................. 710/35; 710/10; 710/33; 711/5; 711/105; 711/154; 711/169; 711/170; 711/171; 711/172; 712/1; 712/210; 712/220; 712/225
(58) Field of Search .................. 710/33–36, 307, 710/10; 711/140, 147, 150, 154, 169–173, 5, 105; 712/204–206, 210, 215, 1, 200, 220, 225, 300

(56) References Cited

U.S. PATENT DOCUMENTS

| | | | | |
|---|---|---|---|---|
| 4,484,303 A | * | 11/1984 | Provanzano et al. | 712/37 |
| 5,179,663 A | * | 1/1993 | Iimura | 710/35 |
| 5,608,686 A | * | 3/1997 | Takai | 365/233 |
| 5,781,918 A | * | 7/1998 | Lieberman et al. | 711/5 |
| 5,809,338 A | * | 9/1998 | Klein | 710/35 |
| 5,854,942 A | * | 12/1998 | Penokie | 710/10 |
| 5,893,927 A | * | 4/1999 | Hovis | 711/171 |
| 5,896,551 A | * | 4/1999 | Williams et al. | 710/35 |
| 5,901,298 A | * | 5/1999 | Cummins et al. | 710/313 |
| 6,003,120 A | | 12/1999 | Hardin | 711/169 |
| 6,108,723 A | * | 8/2000 | Simms et al. | 710/35 |
| 6,148,380 A | | 11/2000 | Dodd et al. | 711/154 |
| 6,154,419 A | | 11/2000 | Shakkarwar | 365/235 |
| 6,185,637 B1 | * | 2/2001 | Strongin et al. | 710/35 |
| 6,298,420 B1 | | 10/2001 | Chittor et al. | 711/147 |
| 6,304,947 B1 | * | 10/2001 | Killig et al. | 711/154 |
| 6,393,500 B1 | * | 5/2002 | Thekkath | 710/35 |
| 6,412,048 B1 | * | 6/2002 | Chauvel et al. | 711/158 |
| 6,457,075 B1 | * | 9/2002 | Koutsoures | 710/35 |
| 6,470,409 B1 | * | 10/2002 | Ridgeway | 710/305 |
| 6,473,814 B1 | * | 10/2002 | Lyons et al. | 710/35 |
| 6,523,085 B1 | * | 2/2003 | Hodges et al. | 711/112 |
| 6,609,163 B1 | * | 8/2003 | Nguyen et al. | 710/21 |
| 6,615,308 B1 | * | 9/2003 | Fanning | 711/105 |
| 2002/0007435 A1 | * | 1/2002 | Banks et al. | 711/105 |
| 2003/0182513 A1 | * | 9/2003 | Dodd et al. | 711/137 |

* cited by examiner

Primary Examiner—Jeffrey Gaffin
Assistant Examiner—Tanh Nguyen
(74) Attorney, Agent, or Firm—Fish & Richardson P.C.

(57) ABSTRACT

The present invention includes a method and device for controlling the data length of read and write operations performed on a memory device. The method includes determining a first number of channels available to a memory controller operatively coupled to the memory device; determining a second number representative of the number of populated channels; calculating a burst length based on the first and second numbers; and programming the memory controller to use the burst length as the data length of read and write operations performed on the memory device.

17 Claims, 6 Drawing Sheets

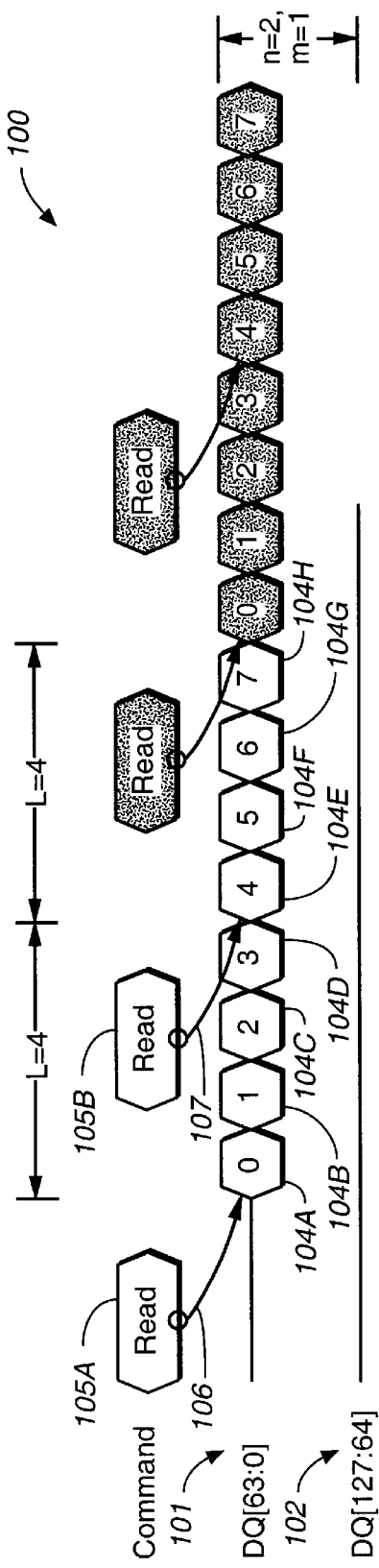
FIG._1 (PRIOR ART)

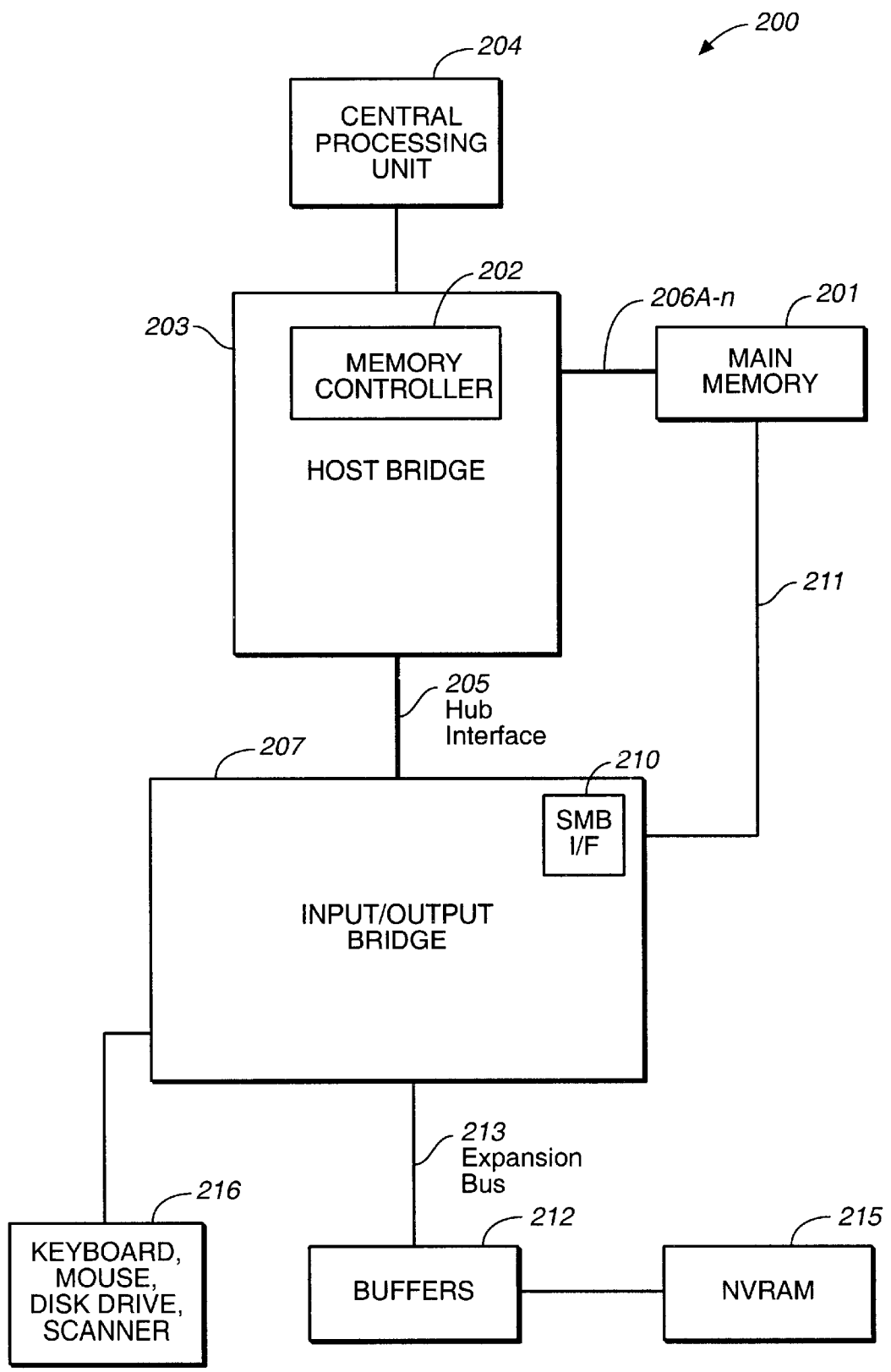
FIG._2

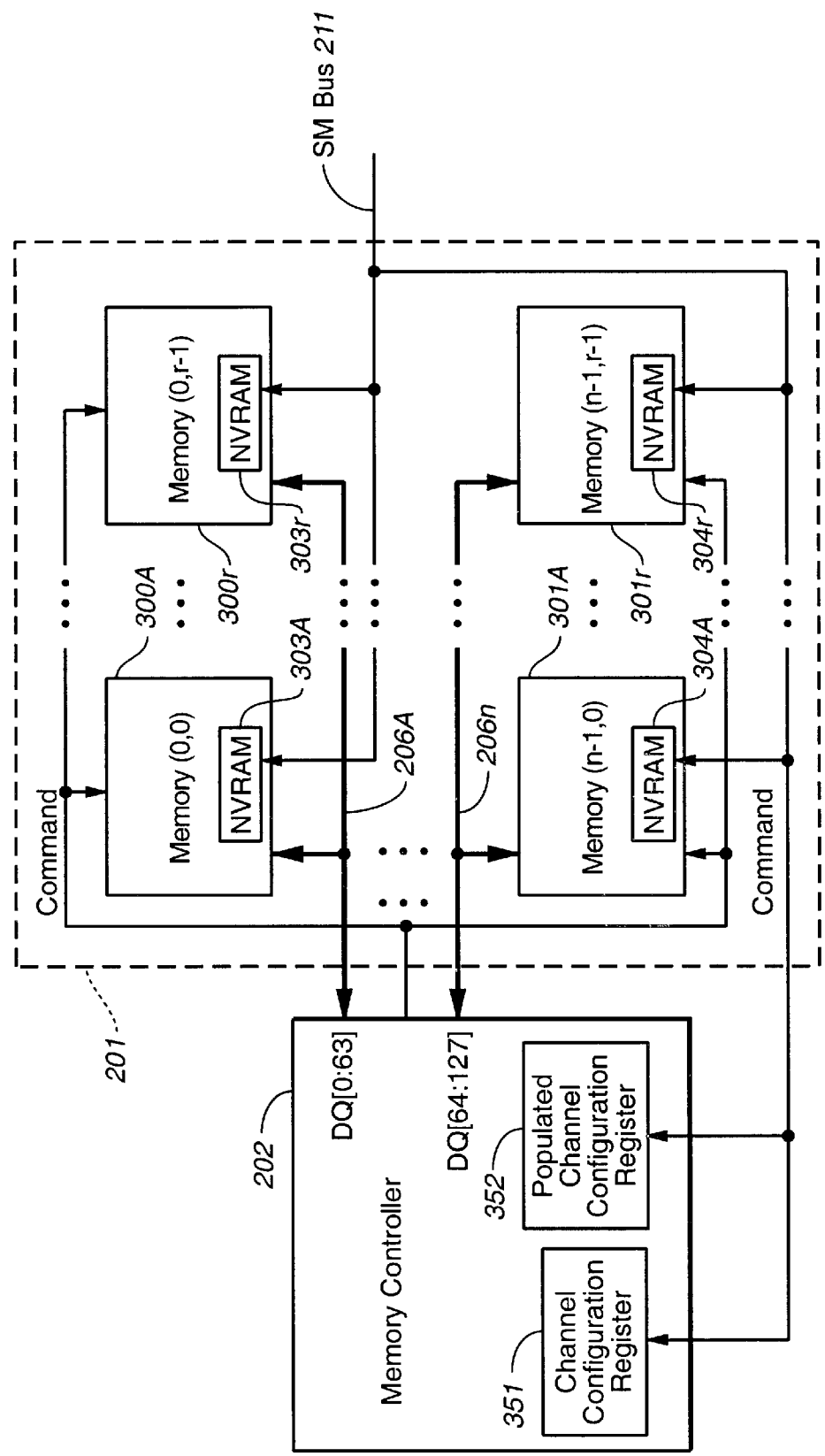
FIG._3A

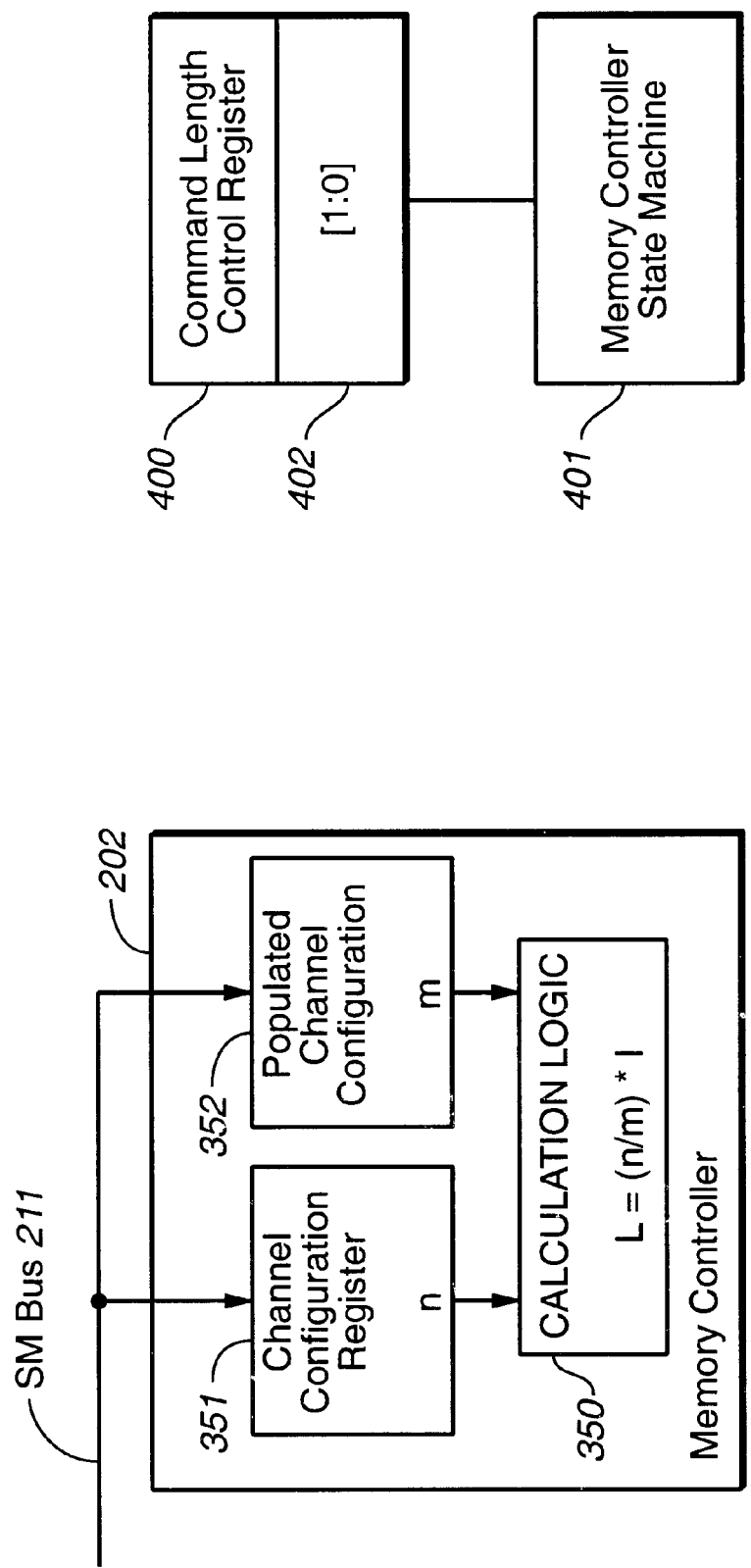

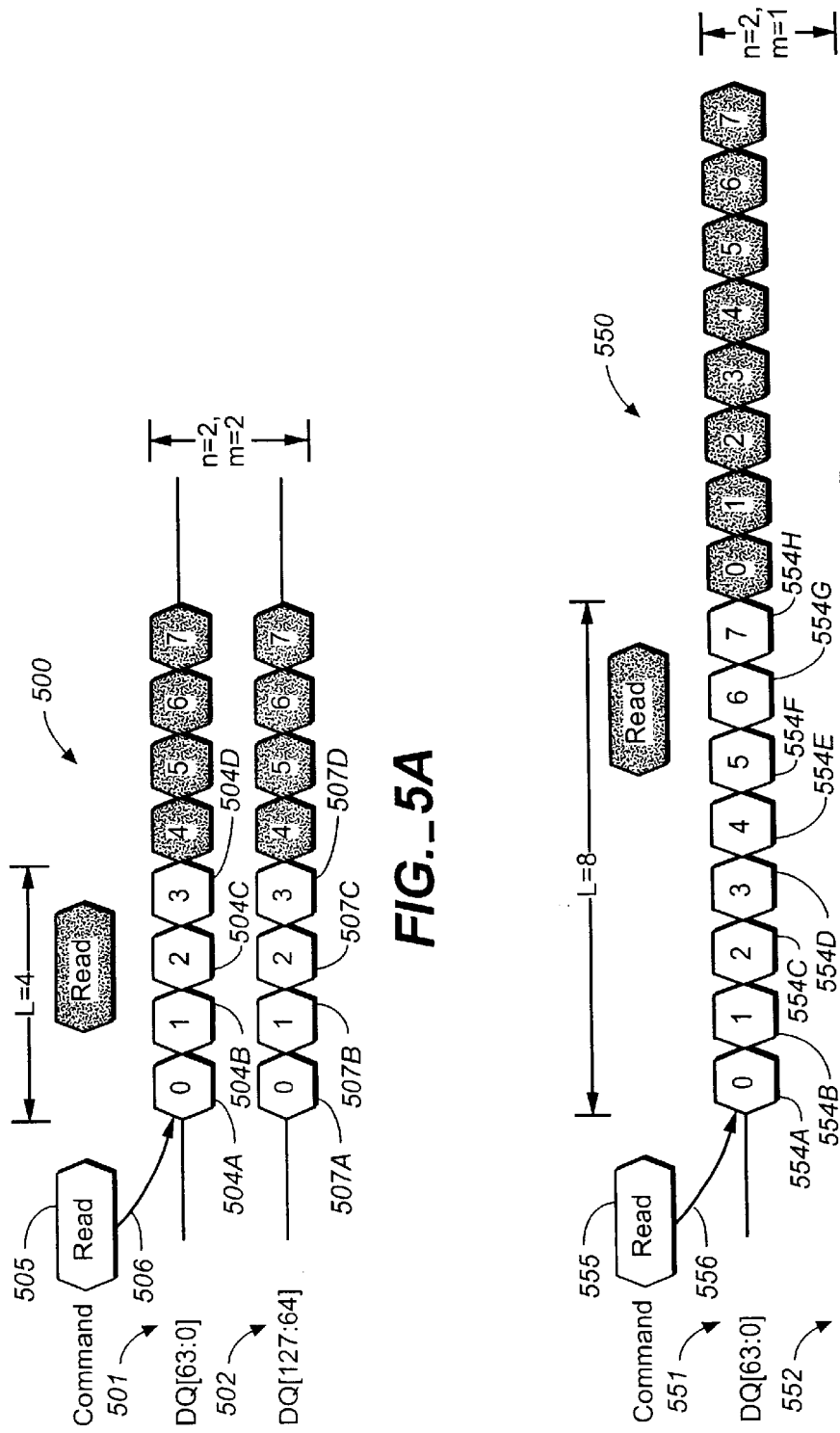

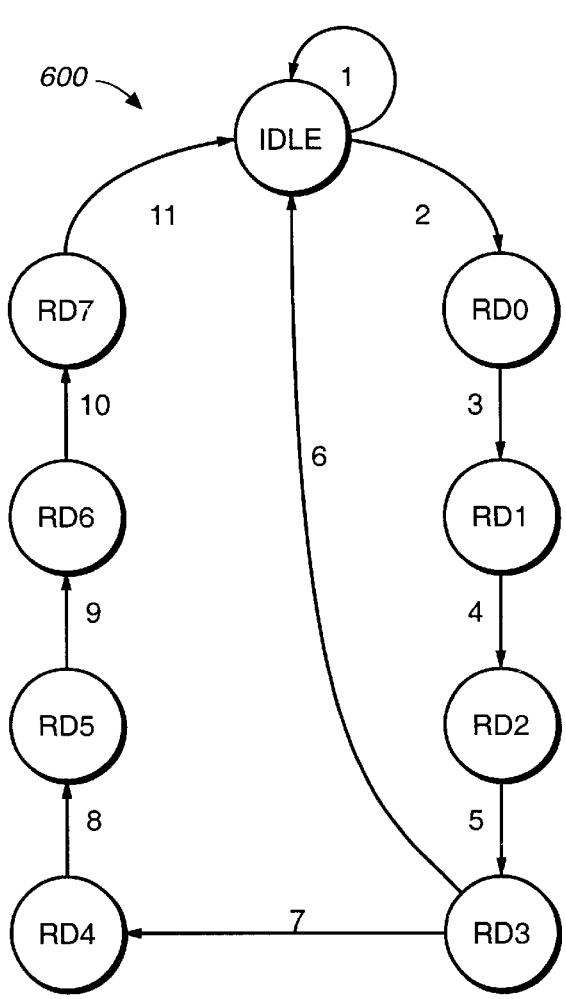
FIG._6
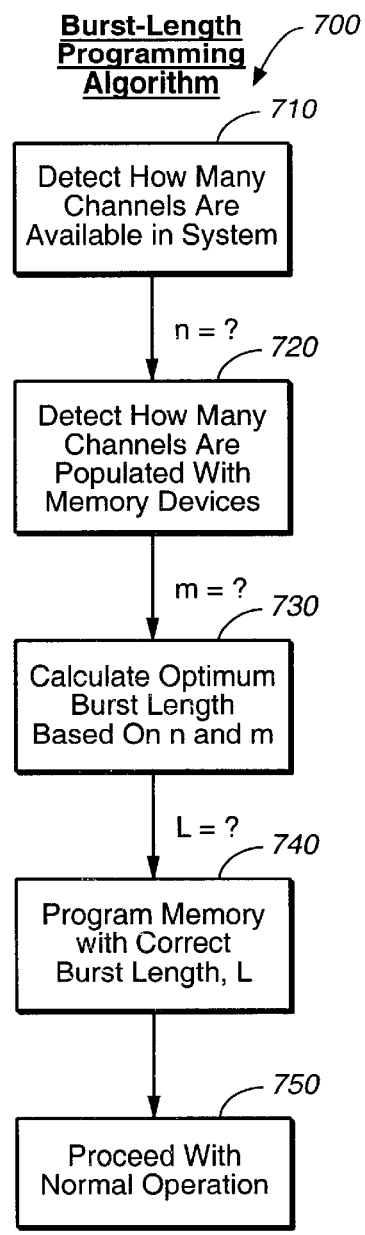
FIG._7

DEVICE AND METHOD FOR MAXIMIZING PERFORMANCE ON A MEMORY INTERFACE WITH A VARIABLE NUMBER OF CHANNELS

BACKGROUND

This invention relates to data communications in a computer system, and more particularly to a memory controller operable to issue variable length read and write commands.

Modern computer systems typically include a host processor coupled to a host bridge. The host bridge interfaces the processor to the rest of the computer system. The host bridge may include a memory controller that is coupled to a system memory, for example Dynamic Random Access Memory (DRAM). A single memory controller can support a plurality of memory channels, where each memory channel is an electrically independent interface with the memory channel's own data bus connecting the memory channel to the memory controller. The larger the number of memory channels, the larger the aggregate bandwidth (amount of information transferred per second between the DRAM and the memory controller). Increasing the number of memory channels also increases the aggregate storage capacity of the memory subsystem by allowing more memory modules/devices to be connected to a single controller.

Most memory controllers perform read and write commands in fixed size amounts of data. This amount of data is called a "line". A line contains L bytes of data. For example, when the memory controller performs a read operation, the controller receives a single line of data (L bytes) for each read command issued. Likewise, when the memory controller performs a write operation, the memory controller transmits a line of data (L bytes) for each write command issued. In an n-channel implementation, each of the channels returns a line of data for each read command. The total amount of data returned to the controller is L*n bytes if all channels are populated. For write commands, the controller transmits L*n bytes, with L bytes being written to each usable memory channel.

Referring to FIG. 1, timing diagram 100 illustrates the operation of a memory controller supporting two channels 101 and 102 with a fixed burst length L=4. As shown, only channel 101 is populated. Assuming a requesting agent requests R=8 bytes of data 104A-H, the controller would be required to issue two read commands 105A and 105B. The first read command 105A would issue at the rising edge of clock 0 106, and the second read command 105B would issue at the rising edge of clock 4 107. In contrast, assuming both channels are populated and the controller uses multiple channels in a lock-step fashion—i.e., each channel receives the same read and write commands and the data is split between the channels—the controller would only be required to issue one read command of length L=4. The single read command would enable the controller to receive the full L*n or 8 bytes. By requiring a larger number of read or write commands in the event that all channels are not populated, conventional memory controllers suffer performance and efficiency losses.

DESCRIPTION OF DRAWINGS

FIG. 1 is a timing diagram for a prior art memory controller.

FIG. 2 is a diagram of a computer system employing a memory controller supporting variable numbers of channels.

FIG. 3A is a diagram of the memory subsystem-memory controller and main memory of FIG. 2.

FIG. 3B is diagram of a memory controller implementing calculation logic.

FIG. 4 is a diagram of a command length control register and a memory controller state machine of the memory controller of FIG. 2.

FIG. 5A is a timing diagram illustrating commands utilized in read requests in memory controller supporting two channels, both of which are populated.

FIG. 5B is a timing diagram illustrating commands utilized in read requests in a memory controller supporting two channels, only one of which is populated.

FIG. 6 illustrates a transition state diagram depicting the operation of the memory controller state machine of FIG. 4.

FIG. 7 is a flow chart illustrating the burst length optimization process.

Like reference symbols in the various drawings indicate like elements.

DETAILED DESCRIPTION

Referring to FIG. 2, a computer system 200 includes a main memory 201 controlled by a memory controller 202. Memory controller 202 may be a discrete chip or part of another controller, such as a host bridge 203 interfacing between a central processing unit (processor) 204 and a hub interface 205. Main memory 201 includes memory components. The memory components may be DIMM modules that may contain memory devices such as SDRAM or DDR memory. Memory controller 202 is connected to n memory channels 206A-n, connecting the memory controller to the memory components of main memory 201. Memory channels 206A-n between main memory 201 and memory controller 202 carry control signals, address signals, and data signals.

Host bridge 203 and main memory 201 both interface with an Input/Output (I/O) bridge 207 which provides an interconnection between various peripheral components within the system (e.g. a keyboard, disk drive, scanner, and/or a mouse (216)).

I/O bridge 207 includes a system management (SM) bus interface 210 for coupling to an SM bus 211. SM bus interface 210 may support the serial presence detect protocol to access predefined storage locations in main memory 201 to determine how many channels 206A-n have memory components which are populated with memory devices. The serial presence detect protocol is a standard set by the Joint Electron Device Engineering Council (JEDEC). The standard is referred to as JEDEC Standard 21-C, Configurations for Solid State Memories, published by JEDEC September 2000.

Buffers 212 are provided between I/O bridge 207 via expansion bus 213 and one or more components, such as a nonvolatile memory (NVRAM) 215. NVRAM 215 stores a basic input/output system (BIOS) routine, which is executed in the computer system 200 during initial start-up. In operation, the BIOS routine may be copied to main memory 201.

Referring to FIGS. 2 and 3A, main memory 201 includes, for each channel 206A-n, memory components 300A-r and 301A-r. Memory controller 202 may provide one or more commands operable to interface with memory components 300A-r and 301A-r.

Each memory component 300A-r and 301A-r includes an NVRAM 303A-r and 304A-r configured according to the serial presence detect protocol. The information stored in the NVRAM indicates the type of memory module used, e.g., memory data width, memory size, DDR or SDRAM. During start-up, a BIOS routine executed by processor 204 determines the total number of channels n 206A-n connected to memory controller 202. The BIOS routine may also program SMB interface 210 in I/O bridge 207, accessing predetermined locations in NVRAMs 303A-r and 304A-r to determine whether or not memory components 300A-r and 301A-r are populated with memory. Based on the accessed information, the number of populated channels m (the total number of channels 206A-n that contain memory components 300A-r and 301A-r populated with memory devices) is determined. The BIOS routine may also calculate an optimum burst length L based on n and m using the formula:

$$L=(n/m)*I,$$

where I is a minimum burst length required by the memory interface that is hard-coded into the initialization software and L is the optimum burst length. The optimum burst length L is the minimum burst length required to minimize the number of read or write commands. The lowest limit for the value of the minimum burst length can be the minimum burst length required by the memory devices and/or the memory controller.

Memory controller 202 may include a channel configuration register 351, and a populated channel configuration register 352, described in greater detail below, which are programmable by the BIOS routine to configure memory controller 202 to provide the correct read or write burst length L to memory components 300A-r and 301A-r that are populated with memory.

Referring to FIG. 3B, the optimum burst length L may alternatively be calculated by a calculation logic block 350. The BIOS routine may alternatively program, via SM bus 211, the value of n into a channel configuration register 351 and the value of m into a populated channel configuration register 352. Channel configuration register 351 and populated channel configuration 352 may be included within memory controller 202. Channel configuration register 351 and populated channel configuration register 352 may send n and m, respectively, as inputs into calculation logic block 350 of memory controller 202. Calculation logic block 350 calculates the optimum burst length L using a preprogrammed value of I. Calculation logic block 350 can be implemented in hardware.

Referring to FIG. 4, memory controller 202 (FIG. 2) includes in part a command length control register 400 and a state machine 401. Command length control register 400 may contain a two-bit value [1:0] 402 representing the optimum burst length L determined by the BIOS routine or calculation logic block 350. After the optimum burst length L has been calculated, it is programmed into bits [1:0] 402 of command length control register 400 and then sent to state machine 401 to be used for controlling the length of read and write commands. The operation of state machine 401 will be explained in greater detail below.

Referring to FIGS. 2, 3, and 5A, a timing diagram 500 illustrates the operation of memory controller 202 connected to two channels 501 and 502. Both channels 501 and 502 contain DIMM modules populated with memory devices. In one aspect, at startup the BIOS routine determines that there are two channels 501 and 502 connected to the memory controller 202 and assigns an n value of 2 (n=2). The BIOS routine also accesses the predetermined locations in NVRAMS 303A-r and 304A-r and determines that DIMM modules on both channels 501 and 502 contain memory devices; the BIOS routine assigns an m value of 2 (m=2). Assuming a requesting agent requests R=8 bytes of data, the BIOS routine calculates the optimum burst length L as L=(n/m)*I (where I=4), therefore, L=(2/2)*4=4. Thus, memory controller 202 issues a single read command 505 at the rising edge of clock 0 506 to accommodate the 8 bytes requested, 4 bytes 504A-D from the first channel 501 and 4 bytes 507A-D from the second channel 502. Note that because all channels (in this case both channels 501 and 502) are populated with memory devices, the optimum burst length L is the same as the fixed burst length of FIG. 1. Because all channels are populated, using the smaller, fixed-size burst length results in a need for only one read operation and thus the smaller, fixed-size burst length is the optimum burst length.

Referring to FIGS. 2, 3, and 5B, a timing diagram 550 illustrates the operation of memory controller 202 in a computer system 200 with only one of two channels populated. Although two channels 551 and 552 are connected to memory controller 202, only the first channel 551 contains DIMM modules populated with memory devices. In one aspect, at startup the BIOS routine determines that there are two channels 551 and 552 connected to memory controller 202 and assigns an n value of 2 (n=2). The BIOS routine also accesses the predetermined locations in NVRAMS 303A-r and 304A-r and determines that only DIMM modules on channel 551 contain memory devices and assigns an m value of 1 (m=1). In one aspect, again assuming a requesting agent requests R=8 bytes of data, the BIOS routine calculates the optimum burst length L=(n/m)*I (where I=4), therefore, L=(2/1)*4=8. Thus, memory controller 202 issues a single read command 555 at the rising edge of clock 0 556 to accommodate the 8 bytes requested, 8 bytes 554A-H from the first channel 551.

Because only one of the two channels is populated, memory controller 202 adjusts the burst length to accommodate all 8 bytes in one read operation. Because the 8 bytes cannot be distributed over two channels and read as two four-bit words, memory controller 202 calculates and uses a burst length of 8, allowing for the read operation to read one eight bit word. This burst length is considered the optimum burst length because it is the minimum burst length required to consolidate the read operation into one read command.

Referring to FIG. 6, transition state diagram 600 depicts the operation of the memory controller state machine 401 (FIG. 4). Referring to FIGS. 2, 4, and 6, in one aspect, nine states are used to generate two read or write command lengths—a length of 4 for an optimum burst length of 4 and a length of 8 for an optimum burst length of 8. Transition logic in memory controller state machine 401 uses access information in command length control register 400 to determine accesses to either an optimum burst length of 4 bytes or 8 bytes.

State 1 (IDLE) corresponds to the idle state of memory controller state machine 401. When in IDLE state, memory controller 202 is not performing a read or write command. Memory controller state machine 401 transitions to state 2 (RD0) when a read or write cycle is initiated by processor 204. Memory controller state machine 401 then transitions through the next three states 3–5, or (RD1), (RD2), and (RD3). By the time memory controller state machine 401 transitions to state 5 (RD3), memory controller 202 has accumulated 4 bytes of data. If the optimum burst length L stored in bytes [1:0] 402 of command length control register 400 is 4, then memory controller state machine 401 transitions back to the IDLE state 1. If the optimum burst length L stored in command length control register 400 is 8, then memory controller state machine 401 transitions to state 7 (RD4) and through the next three states 8–10, or (RD5), (RD6), and (RD7). Once in state 10 (RD7), memory controller 202, which has accumulated 8 bytes of data corresponding to the optimum burst length of 8, transitions back to the IDLE state 1.

In the present invention, memory controller state machine 401, using information in command length control register 400, can adjust the length of a read or write command depending on the calculated optimum burst length L. Therefore, the present invention minimizes the number of read and write commands that have to be executed by processor 204, enhancing the performance of the memory interface.

Referring to FIG. 7, a method 700 of implementing the burst length optimization process is illustrated. First, memory controller 202 determines how many channels n are available in the computer system 200 (step 710). After determining the number of channels available, memory controller 202 determines how many channels m are populated with memory devices (step 720). Next, memory controller 202 calculates an optimum burst length L based on n and m (step 730). Finally, memory controller 202 stores the optimum burst length L (step 740) and resumes normal operation (step 750).

Although the present invention has been described herein with reference to a specific preferred embodiment, many modifications and variations therein will be readily occur to those skilled in the art. Accordingly, all such variations and modifications are included within the intended scope of the present invention as defined by the following claims.

What is claimed is:

1. A method for controlling the data length of read and write operations performed on a memory device comprising:

determining a first number of channels available to a memory controller operatively coupled to the memory device;

determining a second number of populated channels available to the memory controller;

calculating a burst length based on the first and second numbers; and using the burst length as the data length of read and write operations performed on the memory device.

2. The method of claim 1, calculating the burst length comprising calculating a burst length directly proportional to the first number and inversely proportional to the second number.

3. The method of claim 2, calculating the burst length to be equal to the product of the first number and a constant divided by the second number.

4. The method of claim 1, comprising using the burst length as the data length of read and write operations performed on synchronous dynamic random access memory (SDRAM).

5. The method of claim 1, comprising using the burst length as the data length of read and write operations performed on double data rate (DDR) memory.

6. A controller for a memory device, the controller operatively connected to a plurality of channels, all or a subset of which are populated, comprising:

a routine configured to determine a first number of channels available to the controller and a second number of the first number of channels which are populated;

logic configured to calculate a burst length based on the first number and second number of channels;

a control register configured to receive and store the burst length; and a state machine operable to perform read and write commands on the memory device using the burst length as the data length for the commands.

7. The controller of claim 6, the logic operable to calculate a burst length directly proportional to the first number and inversely proportional to the second number.

8. The controller of claim 6, the logic operable to calculate a burst length equal to the product of the first number and a constant divided by the second number.

9. The controller of claim 6, the state machine operable to perform a command on synchronous dynamic random access memory (SDRAM) using the burst length as the data length for the command.

10. The controller of claim 6, the state machine operable to perform a command on double data rate (DDR) memory using the burst length as the data length for the command.

11. The controller of claim 6, wherein the logic is implemented in hardware.

12. A system comprising:

a data processor;

a memory device; and a memory controller operable to control the memory device, the memory controller comprising:

a routine configured to determine a first number of channels available to the controller and a second number of the first number of channels which are populated;

logic configured to calculate a burst length based on the first number and second number of channels;

a control register configured to receive and store the burst length in response to a read or write request from the data processor; and a state machine operable to perform read and write commands on the memory device using the burst length as the data length for the commands.

13. The system of claim 12, the logic operable to calculate a burst length directly proportional to the first number and inversely proportional to the second number.

14. The system of claim 12, the logic operable to calculate a burst length equal to the product of the first number and a constant divided by the second number.

15. The system of claim 12, the state machine operable to perform a command on synchronous dynamic random access memory (SDRAM) using the burst length as the data length for the command.

16. The system of claim 12, the state machine operable to perform a command on double data rate (DDR) memory using the burst length as the data length for the command.

17. The system of claim 12, wherein the logic is implemented in hardware.

\* \* \* \* \*